United States Patent [19]
Toda

[11] Patent Number: 5,389,852
[45] Date of Patent: Feb. 14, 1995

[54] ULTRASONIC SIGNAL CONVERTER

[76] Inventor: Kohji Toda, 1-49-18 Futaba, Yokosuka 239, Japan

[21] Appl. No.: 151,138

[22] Filed: Nov. 12, 1993

[30] Foreign Application Priority Data

Nov. 20, 1992 [JP] Japan .................... 4-335640
Dec. 14, 1992 [JP] Japan .................... 4-354316
Dec. 24, 1992 [JP] Japan .................... 4-359440

[51] Int. Cl.6 ........................................ H01L 41/08
[52] U.S. Cl. ............................... 310/366; 310/369; 310/317; 310/357
[58] Field of Search ............... 310/318, 366, 368, 369, 310/357–359, 376

[56] References Cited

U.S. PATENT DOCUMENTS

| | | | |
|---|---|---|---|
| 3,944,951 | 3/1976 | Kurth | 310/366 X |
| 4,336,510 | 6/1982 | Miyamori | 310/357 X |
| 4,392,074 | 7/1983 | Kleinschmidt et al. | 310/366 X |
| 5,121,025 | 6/1992 | Toda | 310/366 X |
| 5,216,317 | 6/1993 | Rydborn | 310/366 |
| 5,229,680 | 7/1993 | Sato et al. | 310/358 X |

*Primary Examiner*—Mark O. Budd

[57] ABSTRACT

An ultrasonic device including a piezoelectric vibrator for converting an electric signal. The piezoelectric vibrator consists of a pillar-like piezoelectric ceramic and a pair of electrodes, A and B, positioned thereon on both end surfaces, ZA and ZB respectively, perpendicular to the polarization axis of the piezoelectric ceramic. The electrode A consists of at least two parts, namely electrodes A1 and A2, such that the electrodes A1 and A2 are not connected to each other. The electrode B consists of at least two parts, namely electrodes B1 and B2, such that the electrodes B1 and B2 are not connected to each other. If the ultrasonic signal converter is connected to a circuit X through the electrodes A1 and A2 and a circuit Y through the electrodes B1 and B2, then when a high-frequency electric signal S1 with a voltage V1 is applied from the circuit X to the piezoelectric ceramic, the piezoelectric vibrator can be vibrated effectively at a frequency, almost the same as the resonance frequency of the piezoelectric ceramic. This vibration of the piezoelectric vibrator is converted to an electric signal S2 with a voltage V2 having almost the same frequency as the resonance frequency of the piezoelectric ceramic. The electric signal S2 is then delivered toward the circuit Y. Thus, the ultrasonic signal converter makes it possible to convert an electric signal and an acoustic vibration to each other with a large efficiency.

19 Claims, 6 Drawing Sheets

ULTRASONIC SIGNAL CONVERTER

BACKGROUND OF THE INVENTION

1. Field of the Invention.

The present invention relates to an ultrasonic device, having a piezoelectric vibrator used as an electromechanical conversion means, for converting an electric signal applied to the piezoelectric vibrator to the acoustic vibration and then converting the acoustic vibration again to an electric signal which is delivered from the piezoelectric vibrator.

2. Description of the Prior Art.

Conventional signal converters include, for example, a transducer in a circuit for a switching power supply. Switching power supplies are employed extensively as power supplies for telegraphic instruments, electric computers and so on. Conventional switching power supplies transduce a power supply with direct current to an electric power with high frequency by using a high speed switching effect of a semiconductor, and next control and rectify the electric power to obtain a favorite direct current. In order to miniaturize switching power supplies, it is necessary for instance to promote a technique for driving at higher switching frequencies and to size all sorts of parts down. On the other hand, driving at higher switching frequencies bring damages on a semiconductor and an electromagnetic transformer. Therefore, it is difficult to miniaturize switching power supplies. The damages on the semiconductor and the electromagnetic transformer increase over 1 MHz of switching frequencies. Accordingly, it is difficult to more miniaturize switching power supplies. In order to minimize the damage on the semiconductor, it is necessary to improve a delay of a switching action generated in a switching circuit by way of the resonance and so forth. In order to minimize the damage of the electromagnetic transformer, it is necessary to improve the materials of the electromagnetic transformer. However, remarkable improvements of the materials of the electromagnetic transformer are difficult.

There are various attempts for using a piezoelectric transformer in a circuit of switching power supply. Conventional piezoelectric transformers include a polarization converting type transformer made from piezoelectric ceramics (a), a side effecting type transformer made from a single crystal of $LiNbO_3$ (b) and a longitudinal vibrating type transformer made from laminated ceramics (c).

The piezoelectric transformer with type (a) uses two piezoelectric ceramics whose polarization axises are different from each other and electrodes whose arrangement are contrived, in order to increase the voltage ratio of the input side to the output side. The piezoelectric transformer with type (a) employed as a transformer for generating high voltage has a small-sized and incombustible structure showing a difficulty of a large amplitude action on account of an acoustic damage of the materials, electric and acoustic hysteresis phenomena of the materials and so on.

The piezoelectric transformer with type (b) having a simple structure with a small damage of the crystal has a small transmissible power on account of the influence of minute cracks in the side section of the crystal. Moreover, the piezoelectric transformers with type (b) show characteristic disagreements with each other.

The piezoelectric transformer with type (c) has a laminated structure, where the piled layers of the input side to the output side is different and therefore the capacitance ratio of the input side to the output side is different. When the piezoelectric transformer with type (c) is applied in a power supply circuit, it is difficult to control the voltage ratio in case that a load resistance is low. Moreover, the piezoelectric transformer with type (c) is easy to be broken by the large power. In addition, it is difficult for supporting a piezoelectric body. Further, it is necessary to reinforce the support in proportion to the increase of power. However, excessive reinforcement is easy to break the piezoelectric body.

SUMMARY OF THE INVENTION

An object of the present invention is to provide a signal converter capable of converting an electric signal, applied from a circuit X, to the acoustic vibration effectively.

Another object of the present invention is to provide a signal converter capable of converting the acoustic vibration to an electric signal effectively and delivering the electric signal toward a circuit Y.

Another object of the present invention is to provide a signal converter capable of the circuit X and the circuit Y being not connected to each other.

A still other object of the present invention is to provide a signal converter with a small size which is very light in weight and has a simple structure.

A still further object of the present invention is to provide a signal converter applicable widely, for example as a switching power supply and so on.

According to one aspect of the present invention there is provided a signal converter comprising a piezoelectric vibrator composed of a pillar-like piezoelectric ceramic and a pair of electrodes, A and B, formed on both end surfaces, ZA and ZB, respectively of the piezoelectric ceramic. The two surfaces, ZA and ZB, are running perpendicular to the polarization axis of the piezoelectric ceramic.

According to another aspect of the present invention there is provided an electrode A consisting of at least two parts, that is electrodes A1 and A2, such that the electrodes A1 and A2 are not connected to each other.

According to other aspect of the present invention there is provided an electrode B consisting of at least two parts, that is electrodes B1 and B2, such that the electrodes B1 and B2 are not connected to each other.

According to a further aspect of the present invention there is provided a means for transducing an electric signal, wherein a high-frequency electric signal S1 with a voltage V1 is applied from a circuit X to the piezoelectric ceramic through the electrodes A1 and A2, the piezoelectric vibrator vibrating at a frequency, almost the same as the resonance frequency of the piezoelectric ceramic, the vibration of the piezoelectric vibrator being converted to an electric signal S2 with a voltage V2 having almost the same frequency as the resonance frequency, the electric signal S2 being delivered toward a circuit Y through the electrodes B1 and B2.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
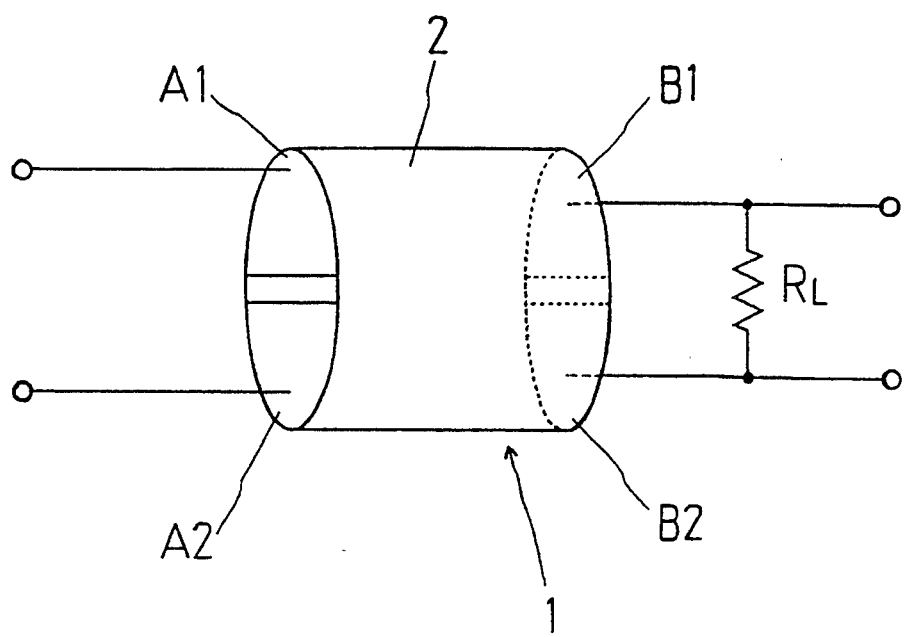
FIG. 1 shows a perspective view of the ultrasonic signal converter according to a first embodiment of the present invention.

FIG. 1 shows a perspective view of an ultrasonic signal converter according to a first embodiment of the present invention. The ultrasonic signal converter comprises a piezoelectric vibrator 1 and a load resistance $R_L$. The piezoelectric vibrator 1 has a cylindrical-like piezoelectric ceramic 2, of which material is TDK-91A (Brand name), and a pair of electrodes mounted on the both end surfaces of the piezoelectric ceramic 2. Thus, the ultrasonic signal converter has such a simple structure. There are two types of the piezoelectric ceramic 2, a first type thereof having dimensions of 10 mm in length and in diameter with a resonance frequency of about 138 kHz, a second type thereof having dimensions of 5 mm in length and in diameter with a resonance frequency of about 277 kHz. An electrode mounted on an end surface of the piezoelectric ceramic 2 is necessary to be divided into at least two parts. Thus, one electrode mounted on one end surface of the piezoelectric ceramic 2 makes two parts, B1 and B2 which are insulated from each other, an area ratio between the electrodes B1 and B2 being nearly 1. The other electrode mounted on the other end surface of the piezoelectric ceramic 2 makes two parts, A1 and A2 which are insulated from each other, an area ratio between the electrodes A1 and A2 being nearly 1. The load resistance $R_L$ is connected between the electrodes B1 and B2. The electrode A1 is used as a driving electrode and the electrode A2 as a feedback electrode. When the ultrasonic signal converter is connected to a circuit X through the electrodes A1 and A2, as well as a circuit Y through the electrodes B1 and B2, the ultrasonic signal converter can convert an electric signal S1 with a high-frequency applied from the circuit X to an electric signal S2 and then deliver the electric signal S2 toward the circuit Y. At this time, the ultrasonic signal converter can insulate the circuit X and the circuit Y from each other. If the electric signal S1 having substantially the same frequency as the resonance frequency of the piezoelectric vibrator 1 is applied to the piezoelectric vibrator 1 through the electrodes A1 and A2, the piezoelectric vibrator 1 is vibrated. This vibration of the piezoelectric vibrator 1 is converted to the electric signal S2 having substantially the same frequency as the resonance frequency of the piezoelectric vibrator 1 again, and the electric signal S2 is delivered through the electrodes B1 and B2. Thus, the electric signal applied to the piezoelectric vibrator 1 is once converted to an acoustic vibration, the acoustic vibration being converted to the electric signal again, the electric signal being delivered. In this time, a wave substantially the same as the sine wave is observed through the electrodes B1 and B2. Consequently, the ultrasonic signal converter according to the present invention has a function of transducing an electric signal and an acoustic vibration each other. A switching power supply is given as one of the applicable examinations of the ultrasonic signal converter.

Figure 2:
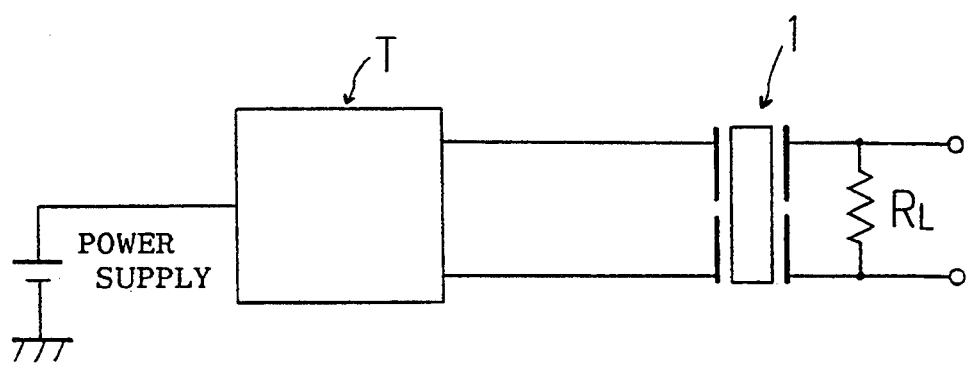
FIG. 2 shows a schematic illustration of a switching power supply made from the ultrasonic signal converter shown in FIG. 1.

FIG. 2 shows a schematic illustration of a switching power supply made from the ultrasonic signal converter shown in FIG. 1. The piezoelectric vibrator 1 is jointed to a self oscillator circuit T as the circuit X, which is provided with an electric power from a direct current power supply and vibrate the piezoelectric vibrator 1 thereby. The vibration of the piezoelectric vibrator 1 is converted to an electric signal again and the electric signal is delivered through the both terminals of the load resistance $R_L$. In this time, the piezoelectric vibrator 1 produces an effect for increasing the voltage. In addition, it is possible to control the magnitude of the increase of the voltage by way of varying the magnitude of the load resistance $R_L$. Thus, it is possible to obtain a voltage corresponding to the magnitude of the load resistance $R_L$. The switching power supply having the ultrasonic signal converter makes it possible to increase an input voltage with a high efficiency. As the ultrasonic signal converter has a small size which is very light in weight and has a simple structure, the switching power supply is able to have not only a small size which is very light in weight but also a large effect for increasing a voltage.

The circuit X is necessary to vibrate the piezoelectric vibrator 1 effectively. In addition, the circuit X is desirable to have a function to generate a high voltage with a high-frequency and follow a resonance frequency of the piezoelectric vibrator 1, because the resonance frequency of the piezoelectric vibrator is varied under the influence of temperature and so forth. Accordingly, the circuit X is desirable to satisfy the resonance frequency, the voltage, the power and others, moreover to have a function to follow the resonance frequency automatically. There is a self oscillation system which is effective to make the resonance frequency of the piezoelectric vibrator 1 follow the output frequency automatically. The self oscillation system which employs a circuit having an oscillator, a voltage amplifier and a power amplifier therein adopts a system to oscillate by utilizing the resonance of the piezoelectric vibrator 1 without an original oscillator circuit inside. Thus, the electrodes A1 and A2 in the ultrasonic signal converter can be used as electrodes for a self oscillator power supply. By employing a self oscillator circuit, it becomes possible to vibrate a piezoelectric vibrator at a frequency followed by a resonance frequency of the piezoelectric vibrator.

If the circuit X includes a means for providing the piezoelectric vibrator 1 with an alternative current pulse power and controlling a pulse width and a pulse repetition frequency of the alternative current pulse power, and a means for controlling the magnitude of the voltage of the alternative current pulse power, the piezoelectric vibrator 1 can be vibrated effectively. Therefore, a voltage, even if weak, can be increased effectively.

A circuit for rectifying an output power with a high-frequency and generating a direct current power can be used as the circuit Y. At this time, the ultrasonic signal converter plays a key role in a switching power supply. Thus, an input voltage, even if weak, can be increased effectively and then can be delivered.

Figure 3:
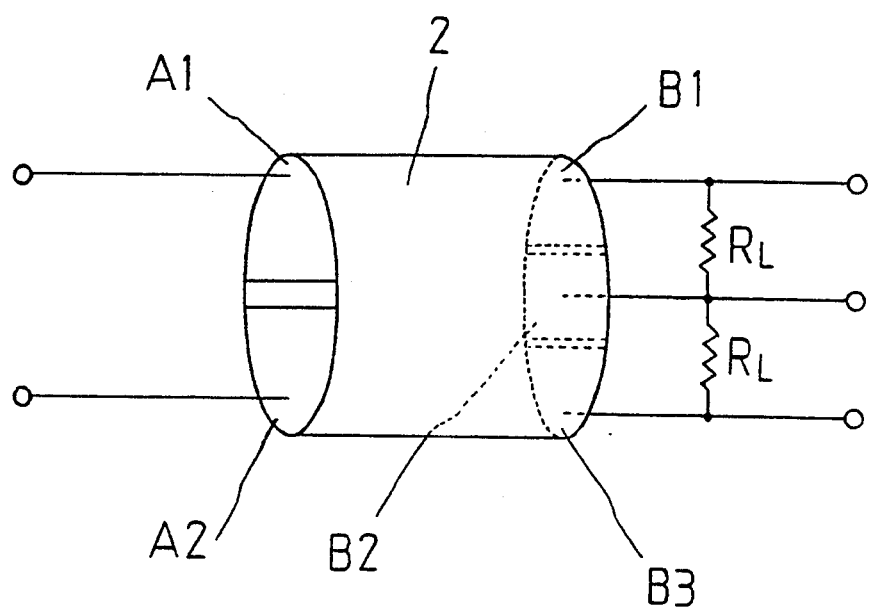
FIG. 3 shows a perspective view of the ultrasonic signal converter according to a second embodiment of the present invention.

FIG. 3 shows a perspective view of the ultrasonic signal converter according to a second embodiment of the present invention. The ultrasonic signal converter comprises a piezoelectric ceramic 2, electrodes, A1, A2, B1, B2 and B3 mounted on the both end surfaces thereof and two load resistances $R_L$. The electrode A1 used as a driving electrode and the electrode A2 used as a feedback electrode are mounted on the same end surface and insulated from each other, an area ratio between the electrodes A1 and A2 being nearly 1. The electrodes B1, B2 and B3 are mounted on the same end surface and insulated from each other. That the diameter of the end surface, on which the electrodes B1, B2 and B3 are mounted, is divided into three equal parts makes the electrodes B1, B2 and B3. One load resistance $R_L$ is connected between the electrodes B1 and B2, and another is connected between the electrodes B2 and B3. A wave substantially the same as the sine wave is observed through not only the electrodes B1 and B2 but also the electrodes B2 and B3, when operating the ultrasonic signal converter shown in FIG. 3. The ultrasonic signal converter shown in FIG. 3 can be applied to a switching power supply. At this time, it is possible to control the magnitude of an increase of a voltage by way of varying the magnitude of the load resistance $R_L$. Moreover, the increased voltage can be delivered through not only the electrodes B1 and B2 but also the electrodes B2 and B3 at the same time. Therefore, a switching power supply employing such the ultrasonic signal converter as shown in FIG. 3 makes it possible to increase an applied voltage and deliver the voltage from the two places of the ultrasonic signal converter.

Figure 4:
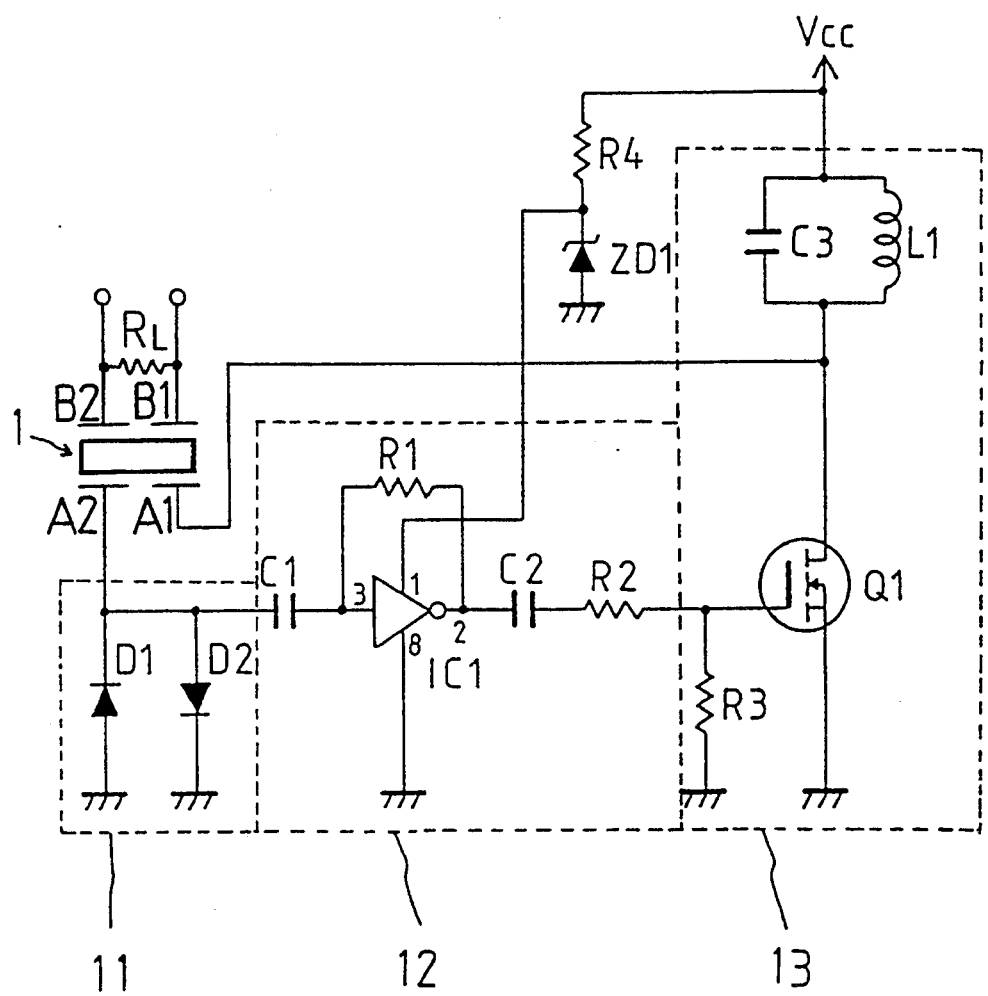
FIG. 4 shows a diagram of the self oscillator circuit T shown in FIG. 2.

FIG. 4 shows a diagram of the self oscillator circuit T shown in FIG. 2. The self oscillator circuit T comprises a current sensing part 11, a voltage amplifying part 12 and a power amplifying part 13. IC ($IC_3$) is used for a power supply which supplies a switching semiconductor with an amplified feedback signal from the piezoelectric vibrator 1. However, $IC_3$ is not drawn in FIG. 4. The driving voltage of the piezoelectric vibrator 1 is 50 Vp-p when the voltage of the power supply is 12 V. Therefore, the piezoelectric vibrator 1 can be driven with a peak voltage four times larger than the voltage of the power supply.

The power amplifying part 13 is composed of $Q_1$, $L_1$, $C_3$ and $R_3$. The transistor $Q_1$ is for switching, and uses a power MOSFET in consideration of a switching speed and a simplicity of driving. The coil $L_1$ is used for supplying the piezoelectric vibrator 1 with a power having a voltage larger than the power supply voltage Vcc by generating an electromotive force. The condenser $C_3$ is for regulating the time constant of electromotive force. When enhancing $C_3$, the time constant becomes larger and the maximum voltage is smaller. When reducing $C_3$, the time constant is smaller and the maximum voltage is larger.

The current detecting part 11 comprises two diodes $D_1$ and $D_2$ for detecting and rectifying, and is intended for detecting the phase of a current in the piezoelectric vibrator 1. As shown in FIG. 3, the current detecting part 11 is connected in series to the piezoelectric vibrator 1. In proportion as an impedance of the current detecting part 11 is larger, the voltage provided to the piezoelectric vibrator 1 becomes smaller. Therefore, the current detecting part 11 is favourable to have a smaller impedance. However, if the impedance is too small, the detected voltage becomes small. Accordingly, the rise time for self oscillation becomes late.

In the current detecting part 11 two diodes are used. Generally, a diode acts as a high-resistance at the time when self oscillation begins and then the voltage is small, and as a low-resistance at the time when self oscillation is stabilized and then the voltage is large, considering the relationship between current and voltage in the diode. Accordingly, the diodes $D_1$ and $D_2$ are favorable as elements in the current detecting part 11.

The voltage amplifying part 12 comprises $IC_1$, $C_1$, $C_2$, $R_1$ and $R_2$, and is intended for amplifying a small voltage signal detected in the current detecting part 11 and driving the next part, that is the power amplifying part 13. For the purpose of obtaining enough high-frequency power to drive the piezoelectric vibrator 1 when a power amplifying means is composed of a transistor and so on, a voltage amplifying part with an amplifier is necessary for obtaining a large gain at high speed. In this embodiment the inverter $IC_1$ composed of CMOS logic IC is used in the voltage amplifying part 12. When feedbacking the inverter $IC_1$ via the resistance $R_1$, the voltage amplifying part 12 does not work around the threshold. Thus, the voltage amplifying part 12 acts as an analog amplifier. Though the circuit of the voltage amplifying part 12 has a large gain at high speed, there is a limit of a voltage in the power supply. Therefore, the inverter $IC_1$ is supplied with a fixed voltage by using the Zener diode $ZD_1$ with 5.1 V in the circuit shown in FIG. 3. The condensers $C_1$ and $C_2$ are for cutting the direct current component.

In the circuit shown in FIG. 3, $Q_1$ and $L_1$ for switching are used in order to make it possible to drive at a low voltage. When enhancing a voltage by using a combination of a transistor and a coil or by a transducer to the same degree, a combination of a transistor and a coil has a smaller size which is very light in weight and is cheaper than a transducer. In addition, as the load circuit of the power amplifying part 13 uses $L_1$ and $C_3$ without a resistor, the energy conversion efficiency increases.

If the circuit X comprises an oscillator circuit consisting of a positive feedback amplifier circuit and a resonance circuit connected thereto, the piezoelectric ceramic 2 acts as a resonance element in the resonance circuit, the positive feedback amplifier circuit being connected between the electrodes A1 and A2. When the positive feedback amplifier circuit includes a power amplification circuit and a phase-sensing circuit, an output power from the power amplification circuit is applied to the piezoelectric vibrator through the electrodes A1 and A2, and the phase-sensing circuit detects a phase of a current through the electrodes A1 and A2. A weak voltage detected by the phase-sensing circuit is amplified, the amplified voltage being used for driving the next circuit, that is the power amplification circuit. The piezoelectric vibrator acts as a resonance element when a voltage from the power amplification circuit is applied thereto. The phase-sensing circuit detects the voltage corresponding to the resonance frequency of the piezoelectric vibrator. The detected voltage is amplified, and then more amplified by the power amplification circuit, after that the amplified voltage is applied to the piezoelectric vibrator. In this way, a positive feedback loop is constructed, and the circuit X has a function of self oscillation. In such a self oscillator circuit the self oscillation can be realized at a frequency where the phases of the current and the voltage existing in the piezoelectric vibrator are equal. The frequency, where the difference of the phases between the current and the voltage is zero, arises at the first resonance frequency or other resonance frequencies. Especially with the first resonance frequency which shows the lowest frequency and the largest electromechanical coefficient, the self oscillation can be realized. When the power amplification circuit includes a transistor as a terminal amplifier element and a coil for enhancing a voltage on the path for applying the transistor with a direct current, the energy conversion efficiency increases. When the phase-sensing circuit comprises a first diode connected in series to the electrodes A1 and A2 and a second diode connected in parallel to the first diode with the opposite polarity to the first diode, an oscillator circuit that makes the piezoelectric vibrator vibrate effectively can be constructed. Consequently, it is possible to increase a voltage effectively, even if it is weak.

Figure 5:
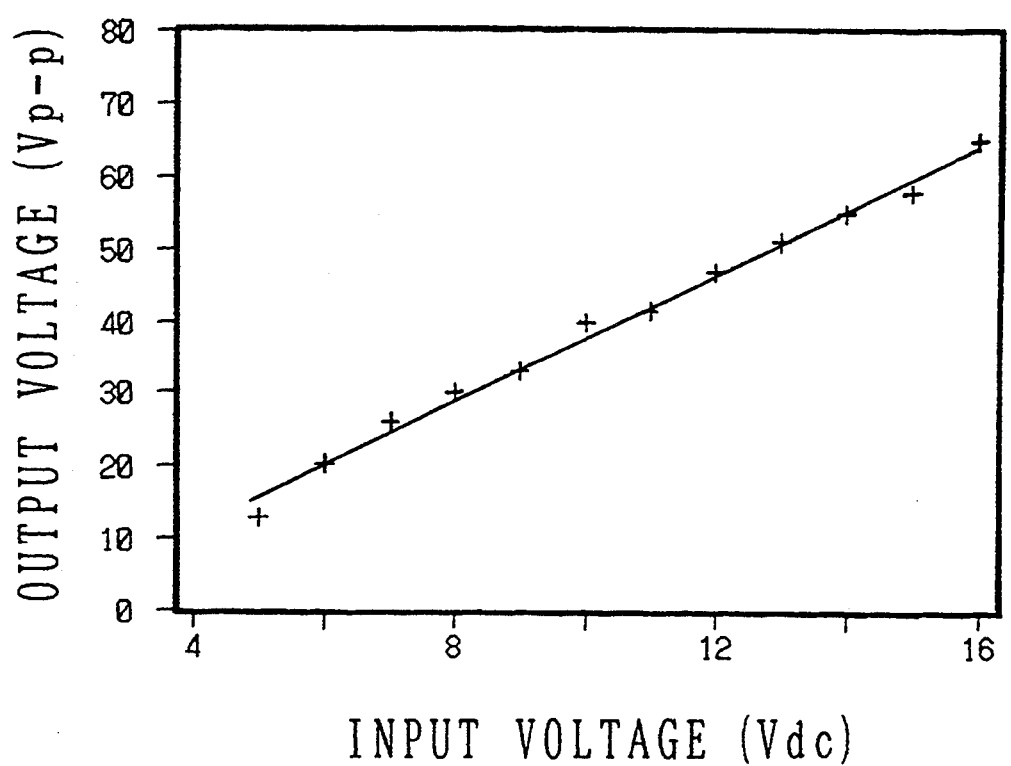
FIG. 5 shows the relationship between the input voltage applied from the power supply and the output voltage delivered through the electrodes B1 and B2 when operating the switching power supply shown in FIG. 2.

FIG. 5 shows the relationship between the direct current input voltage applied from the power supply and the output voltage delivered through the electrodes B1 and B2 when operating the switching power supply shown in FIG. 2. At this time, the piezoelectric vibrator 1 has the dimensions of 5 mm in length and in diameter. The load resistance $R_L$ is 10 kohm. The output voltage is nearly 4.5 times larger than the input voltage.

Figure 6:
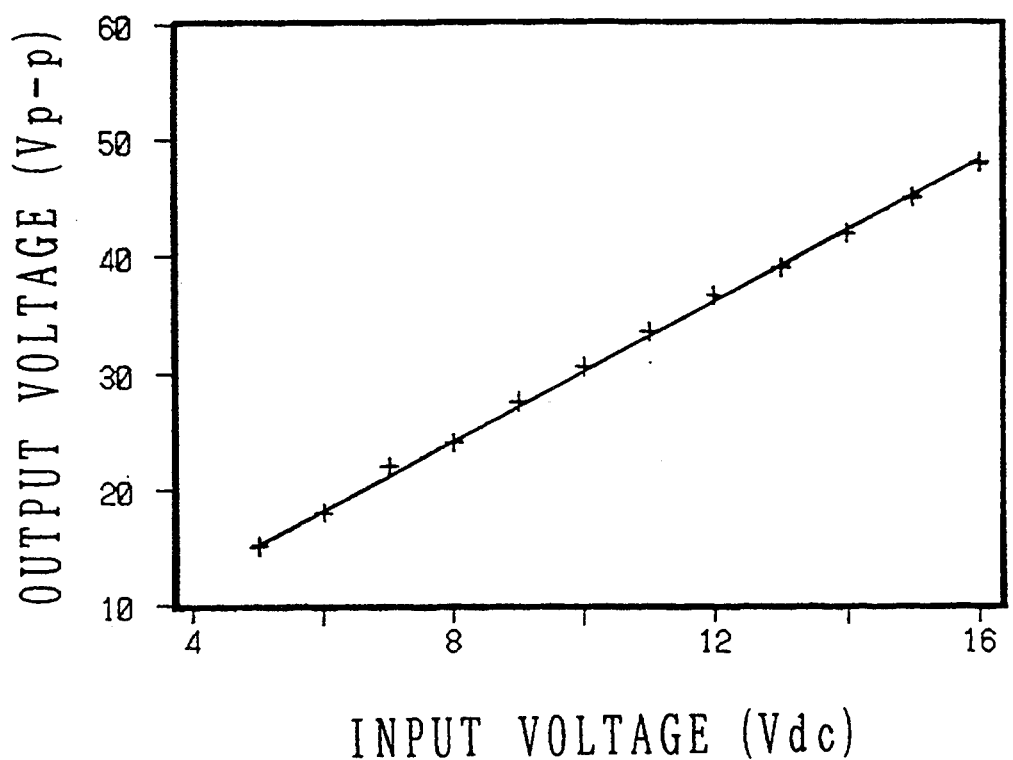
FIG. 6 shows the relationship between the input voltage applied from the power supply and the output voltage delivered through the electrodes B1 and B2 when operating the switching power supply shown in FIG. 2.

FIG. 6 shows the relationship between the input voltage applied from the power supply and the output voltage delivered through the electrodes B1 and B2 when operating the switching power supply shown in FIG. 2. At this time, the piezoelectric vibrator 1 has the dimensions of 10 mm in length and in diameter. The load resistance $R_L$ is 1 kohm. The output voltage shows nearly three times larger than the input voltage.

As the piezoelectric ceramic 2 adopts a cylindrical-like structure in which a ratio of the diameter and the height thereof being nearly 1, the piezoelectric vibrator 1 is vibrated effectively. A switching power supply having the ultrasonic signal converter with such the piezoelectric vibrator 1 can increase an input voltage effectively. In addition, each electrode mounted on the end surface of the piezoelectric ceramic 2 is divided into at least two parts. Therefore, the piezoelectric vibrator 1 is vibrated more effectively, and the vibration is delivered as an electric signal effectively.

A piezoelectric ceramic can employ a rectangular structure in which a ratio of lengths among at least two of the three sides is nearly equal to 1. Also in this case, a piezoelectric vibrator having the piezoelectric ceramic with such the rectangular form is vibrated effectively. Moreover, each electrode mounted on the end surface of the piezoelectric ceramic is divided into at least two parts. Therefore, a switching power supply having the ultrasonic signal converter with such the piezoelectric vibrator can increase an input voltage effectively.

It is an important problem to increase a voltage of a power supply in case of using a few OP amplifiers for 15 V power supply in a logic circuit with 5 V power supply, in case of using a ceramic sensor requiring a high voltage with a low power, and in other cases. A circuit with a transducer is a large scale generally, and IC for increasing a voltage is too expensive. However, a switching power supply with the ultrasonic signal converter of the present invention has not only a small size which is very light in weight but also a large effect for increasing a voltage.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic device for transducing an electric signal comprising:
    a pillar-like piezoelectric ceramic with a cylindrical shape such that the ratio of lengths between diameter and longitudinal directions is nearly equal to 1, said piezoelectric ceramic having two end surfaces, ZA and ZB, running perpendicular to the polarization axis of said piezoelectric ceramic; and
    means for transducing an electric signal consisting of a first transducer element comprising at least two electrodes A1 and A2 forming an input pair, and a second transducer element comprising at least two electrodes B1 and B2 forming an output pair,
    said electrodes A1 and A2 being formed on said surface ZA such that said electrodes A1 and A2 are not connected to each other and are separated by a line dividing the area of said surface ZA nearly at the rate of 1 to 1 and corresponding to diameter of said surface ZA,
    said electrodes B1 and B2 being formed on said surface ZB such that said electrodes B1 and B2 are not connected to each other and are separated by a line dividing the area of said surface ZB nearly at the rate of 1 to 1 and corresponding to diameter of said surface ZB,
    said piezoelectric ceramic, said electrodes A1, A2, B1 and B2 forming a piezoelectric vibrator,
    said first transducer element receiving a high-frequency electric signal S1 with a voltage V1 from the outside, and causing said piezoelectric vibrator to vibrate at a frequency, almost the same as the resonance frequency of said piezoelectric ceramic,
    said second transducer element transducing the acoustic vibration of said piezoelectric vibrator to an electric signal S2 with a voltage V2 having almost the same frequency as said resonance frequency, and delivering said electric signal S2 outside.

2. A device as defined in claim 1 further comprising: a load resistance connected between said electrodes B1 and B2, the magnitude of said voltage V2 corresponding to the magnitude of said load resistance.

3. A device as defined in claim 1 further comprising: a circuit T connected between said electrodes A1 and A2, said circuit T including means for providing an alternative current pulse power as a power of said voltage V1 and controlling a pulse width and a pulse repetition frequency of said alternative current pulse power, and means for controlling the value of said voltage V1.

4. A device as defined in claim 1 said voltage V2 is larger than said voltage V1.

5. A device as defined in claim 3 wherein said circuit T comprises an oscillator circuit consisting of a positive feedback amplifier circuit and a resonance circuit connected to said amplifier circuit, said resonance circuit including said piezoelectric ceramic as a resonance element, said amplifier circuit being connected between said electrodes A1 and A2.

6. A device as defined in claim 5, wherein said amplifier circuit including a power amplification circuit and a phase-sensing circuit, an output power of said power amplification circuit being applied through said electrodes A1 and A2, said phase-sensing circuit detecting a phase of a current through said electrodes A1 and A2, said power amplification circuit amplifying a power of an amplified signal of said phase of said current detected by said phase-sensing circuit, said power amplification circuit including a transistor as a terminal amplifier element and a coil for raising a voltage in a passage for applying said transistor with a direct current.

7. A device as defined in claim 6, wherein said phase-sensing circuit comprises a first diode connected in series to said electrodes A1 and A2 and a second diode connected in parallel to said first diode with the opposite polarity to said first diode.

8. An ultrasonic device for transducing an electric signal comprising:

a piezoelectric ceramic with a cubic shape, said piezoelectric ceramic having two end surfaces, ZA and ZB, running perpendicular to the polarization axis of said piezoelectric ceramic;

means for transducing an electric signal consisting of a first transducer element comprising at least two electrodes A1 and A2 forming an input pair, and a second transducer element comprising at least two electrodes B1 and B2 forming an output pair;

a load resistance connected between said electrodes B1 and B2;

a circuit T connected between said electrodes A1 and A2 comprising an oscillator circuit consisting of a positive feedback amplifier circuit and a resonance circuit connected to said amplifier circuit, said resonance circuit including said piezoelectric ceramic as a resonance element, said amplifier circuit being connected between said electrodes A1 and A2, said electrodes A1 and A2 being formed on said surface ZA such that said electrodes A1 and A2 are not connected to each other and are separated by a line dividing the area of said surface ZA nearly at the rate of 1 to 1 and parallel to one side of said surface ZA, said surface ZB facing to said surface ZA, said electrodes B1 and B2 being formed on said surface ZB such that said electrodes B1 and B2 are not connected to each other and are separated by a line dividing the area of said surface ZB nearly at the rate of 1 to 1 and parallel to one side of said surface ZB, said piezoelectric ceramic, said electrodes A1, A2, B1 and B2 forming a piezoelectric vibrator, said first transducer element receiving a high-frequency electric signal S1 with a voltage V1 from said circuit T, and causing said piezoelectric vibrator to vibrate at a frequency, almost the same as the resonance frequency of said piezoelectric ceramic, said second transducer element transducing the acoustic vibration of said piezoelectric vibrator to an electric signal S2 with a voltage V2 having almost the same frequency as said resonance frequency, and delivering said electric signal S2 outside, the magnitude of said voltage V2 corresponding to the magnitude of said load resistance.

9. A device as defined in claim 8, wherein said circuit T includes means for providing an alternative current pulse power as a power of said voltage V1 and controlling a pulse width and a pulse repetition frequency of said alternative current pulse power, and means for controlling the value of said voltage V1.

10. A device as defined in claim 8, wherein said voltage V2 is larger than said voltage V1.

11. A device as defined in claim 8, wherein said amplifier circuit including a power amplification circuit and a phase-sensing circuit, an output power of said power amplification circuit being applied through said electrodes A1 and A2, said phase-sensing circuit detecting a phase of a current through said electrodes A1 and A2, said power amplification circuit amplifying a power of an amplified signal of said phase of said current detected by said phase-sensing circuit, said power amplification circuit including a transistor as a terminal amplifier element and a coil for raising a voltage in a passage for applying said transistor with a direct current.

12. A device as defined in claim 11, wherein said phase-sensing circuit comprises a first diode connected in series to said electrodes A1 and A2 and a second diode connected in parallel to said first diode with the opposite polarity to said first diode.

13. An ultrasonic device for transducing an electric signal comprising:

a piezoelectric ceramic with a cylindrical shape such that the ratio of lengths between diameter and longitudinal directions is nearly equal to 1, said piezoelectric ceramic having two end surfaces, ZA and ZB, running perpendicular to the polarization axis of said piezoelectric ceramic;

means for transducing an electric signal consisting of a first transducer element comprising two electrodes A1 and A2 forming an input pair, and a second transducer element comprising three electrodes B1, B2 and B3, said electrodes B1 and B2, or said electrodes B2 and B3 forming an output pair; and a circuit T connected between said electrodes A1 and A2 comprising an oscillator circuit consisting of a positive feedback amplifier circuit and a resonance circuit connected to said amplifier circuit, said resonance circuit including said piezoelectric ceramic as a resonance element, said amplifier circuit being connected between said electrodes A1 and A2, said electrodes A1 and A2 being formed on said surface ZA such that said electrodes A1 and A2 are not connected to each other, said electrodes B1, B2 and B3 being formed on said surface ZB such that said electrodes B1, B2 and B3 are not connected to each other, said piezoelectric ceramic, said electrodes A1, A2, B1, B2 and B3 forming a piezoelectric vibrator, said first transducer element receiving a high-frequency electric signal S1 with a voltage V1 from said circuit T, and causing said piezoelectric vibrator to vibrate at a frequency, almost the same as the resonance frequency of said piezoelectric ceramic, said second transducer element transducing the acoustic vibration of said piezoelectric vibrator to an electric signal S2 with a voltage V2 having almost the same frequency as said resonance frequency, and delivering said electric signal S2 outside through said electrodes B1 and B2, or through said electrodes B2 and B3.

14. A device as defined in claim 13, wherein said electrodes A1 and A2 are separated each other by a line dividing the area of said surface ZA into two parts, and said electrodes B1, B2 and B3 are separated each other by two lines dividing the area of said surface ZB into three parts.

15. A device as defined in claim 13, wherein said circuit T includes means for providing an alternative current pulse power as a power of said voltage V1 and controlling a pulse width and a pulse repetition frequency of said alternative current pulse power, and means for controlling the value of said voltage V1.

16. A device as defined in claim 13 wherein said voltage V2 is larger than said voltage V1.

17. A device as defined in claim 13 further comprising:

a first load resistance connected between said electrodes B1 and B2, the magnitude of said voltage V2 corresponding to the magnitude of said first resistance; and a second load resistance connected between said electrodes B2 and B3, the magnitude of said voltage V2 corresponding to the magnitude of said second resistance, 18. A device as defined in claim 13, wherein said amplifier circuit including a power amplification circuit and a phase-sensing circuit, an output power of said power amplification circuit being applied through said electrodes A1 and A2, said phase-sensing circuit detecting a phase of a current through said electrodes A1 and A2, said power amplification circuit amplifying a power of an amplified signal of said phase of said current detected by said phase-sensing circuit, said power amplification circuit including a transistor as a terminal amplifier element and a coil for raising a voltage in a passage for applying said transistor with a direct current.

19. A device as defined in claim 13, wherein said phase-sensing circuit comprises a first diode connected in series to said electrodes A1 and A2 and a second diode connected in parallel to said first diode with the opposite polarity to said first diode.

* * * * *